United States Patent
Arai

(10) Patent No.: US 6,201,598 B1
(45) Date of Patent: Mar. 13, 2001

(54) CHARGED-PARTICLE-BEAM MICROLITHOGRAPHIC EXPOSURE APPARATUS AND RETICLES FOR USE WITH SAME

(75) Inventor: Osamu Arai, Yokosaka (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/298,646

(22) Filed: Apr. 23, 1999

(30) Foreign Application Priority Data

Apr. 23, 1998 (JP) .................................................. 10-131395

(51) Int. Cl.⁷ ........................... G03B 27/68; G03B 27/42; G03B 27/52; G21K 1/08; G21G 5/00
(52) U.S. Cl. ........................ 355/53; 250/492.3; 250/396; 250/397; 355/52; 355/55
(58) Field of Search ................................. 355/53, 52, 68, 355/55; 250/492.3, 397, 396, 492.2

(56) References Cited

U.S. PATENT DOCUMENTS

| | | | |
|---|---|---|---|
| 4,119,854 | * 10/1978 | Tanaka et al. | 250/397 |
| 4,924,257 | 5/1990 | Jain | 355/53 |
| 4,943,730 | * 7/1990 | Takemure et al. | 250/492.3 |
| 5,602,619 | * 2/1997 | Sogard | 355/53 |
| 5,644,383 | * 7/1997 | Mori | 355/68 |
| 5,798,194 | 8/1998 | Nakasuji et al. | |
| 5,812,244 | * 9/1998 | Tonooka et al. | 355/53 |
| 5,831,270 | * 11/1998 | Nakasauji | 250/396 |
| 5,847,813 | * 12/1998 | Hirayanagi | 355/75 |
| 5,854,671 | * 12/1998 | Nishi | 355/53 |
| 5,933,217 | * 8/1999 | Nakasouji | 355/53 |
| 5,966,200 | * 10/1999 | Kawakami et al. | 355/53 |
| 5,969,800 | * 10/1999 | Makinouchi | 355/53 |
| 5,973,766 | * 10/1999 | Matsuura et al. | 355/52 |
| 5,986,765 | * 11/1999 | Nakasauji | 356/399 |
| 5,991,007 | * 11/1999 | Narimatsu | 355/53 |
| 6,028,659 | * 2/2000 | Kaneko | 355/53 |

* cited by examiner

Primary Examiner—Russell Adams
Assistant Examiner—Hung Henry Nguyen
(74) Attorney, Agent, or Firm—Klarquist Sparkman Campbell Leigh & Whinston, LLP

(57) ABSTRACT

Charged-particle-beam (CPB) microlithographic exposure apparatus and reticles for use therewith. The reticle defines a pattern corresponding to a die pattern to be imprinted on the wafer. The pattern on the reticle is divided into multiple subregions separated from each other by light-shielding boundary zones. Multiple reticle subregions are have so as to include a center portion and a peripheral portion. As such reticle subregions are projected onto the substrate, the peripheral portions of adjacent subregions as projected onto the wafer overlap each other.

14 Claims, 8 Drawing Sheets

US 6,201,598 B1

CHARGED-PARTICLE-BEAM MICROLITHOGRAPHIC EXPOSURE APPARATUS AND RETICLES FOR USE WITH SAME

FIELD OF THE INVENTION

This invention relates to charged-particle-beam (CPB) microlithographic exposure apparatus that transfer a pattern for a large-scale integrated (LSI) circuit or the like, as defined on a reticle, onto a sensitive substrate such as a semiconductor wafer using a charged particle beam (e.g., electron beam).

BACKGROUND OF THE INVENTION

Conventional microlithographic exposure systems utilizing a charged particle beam are classified into the following three types:

(1) spot-beam exposure systems
(2) variable-shaped-beam exposure systems
(3) block exposure systems Compared with single-shot projection-exposure methods using conventional light, the charged-particle-beam (CPB) exposure methods listed above offer tantalizing prospects of vastly improved resolution but tend to exhibit disappointingly very low throughput. In particular, exposure methods (1) and (2) involve tracing the pattern feature-by-feature using an electron beam having an extremely small spot diameter or square-shaped transverse profile; consequently, throughput is extremely low with these methods.

Block exposure systems were originally developed with the object of improving throughput over what was achievable with the spot-beam and variable-shaped beam systems. With block exposure systems, throughput is improved by forming a predetermined pattern on the reticle and batch-exposing the pattern. However, the number of patterns formed on the reticle is limited to a small number. Also, a complete die pattern usually cannot be transferred using a block exposure system, and another system (typically a variable-shaped-beam exposure system) must be employed to complete transfer of the entire die pattern. Consequently, the block exposure system has exhibited disappointingly low throughput.

In order to further improve throughput, much effort is currently being expended to develop CPB exposure apparatus based on the so-called "divided" projection-transfer system, which projects and exposes discrete portions of the reticle pattern in a batch manner onto the substrate surface.

Reference is now made to FIGS. 8(A)–8(C) and 9 that depict a conventional CPB microlithograpic exposure apparatus based on the divided projection-transfer system. FIG. 8(A) is a top view of a conventional semiconductor wafer W showing multiple dies (a representative die is denoted by the hatched lines). FIG. 8(B) depicts one die, which is divided into four "stripes" $S_1$–$S_4$ (a representative stripe $S_1$ is denoted by the hatched lines) that are individually and sequentially projected in a scanning manner. The stripes are separated from each other by boundary lines BL extending in the x-direction. (The boundary lines BL are shown for convenience; the boundary lines BL are not actually present on the wafer.) FIG. 8(C) depicts a typical division of a stripe S into multiple "subfields" SF (a representative subfield is denoted by the hatched lines) that are individually and sequentially projected typically in a raster manner. The subfields SF are separated from each other by boundary lines BL' extending in the y-direction and boundary lines BL' extending in the x-direction.

For exposure, the wafer W is normally mounted on a wafer stage (not shown in FIGS. 8(A)–8(C)). During exposure of the reticle pattern, the wafer stage is step-shifted in the y-direction and scan-shifted in the x-direction. Meanwhile, the charged particle beam is deflected in both the x-direction and the y-direction as required to expose each subfield.

After all the subfields in a first stripe $S_1$ are projected, the wafer stage is step-shifted in a y-direction to position the wafer W for exposure of the next stripe $S_2$. During exposure of each stripe, the wafer stage is scan-shifted in an x-direction at a constant velocity as noted in FIG. 8(B). As shown in FIG. 8(C), during exposure of a stripe S, the charged particle beam is deflected in the negative y-direction to batch-expose each of the subfields in the first column $C_1$. The charged particle beam is then deflected in the positive y-direction to batch-expose each of the subfields in the second column $C_2$. The charged particle beam is then deflected in the negative y-direction to batch-expose each of the subfields in the third column $C_3$. Next, the charged particle beam is deflected in the positive y-direction to batch-expose each of the subfields in the fourth column $C_4$. This order of exposure is continued for the remaining columns of subfields. That is, the charged particle beam is deflected in the negative y-direction to expose the subfields in each odd-numbered column, and deflected in the positive y-direction to expose the subfields in each even-numbered column.

For example (FIG. 8(C)), as the charged particle beam is exposing the subfields in the first column $C_1$ of the stripe S, the wafer stage is scan-shifted at a constant velocity in the positive x-direction. Thus, the deflection direction of the charged particle beam is (–y, +x) in the figure. In moving from the first column $C_1$ to the second column $C_2$, the charged particle beam is shifted in the –x direction. The charged particle beam is then deflected in the (+y, +x) direction to expose the subfields in the second column. In moving from the second column $C_2$ to the third column $C_3$, the charged particle beam is shifted in the –x direction. These motions are repeated as exposure progresses along the stripe S to expose all the subfields SF in the stripe.

After the first stripe $S_1$ is exposed, the wafer stage is shifted by one step (approximately equal to the width of one stripe) in the –y direction to position the wafer for exposure of the second stripe $S_2$ as shown in FIG. 8(B). The wafer stage is then scan-shifted in the –x-direction as each subfield in the second stripe $S_2$ is exposed.

It is noted that each die can have one or multiple stripes, and each stripe typically includes multiple subfields.

FIG. 9 shows the relationship between the reticle M and the sensitive substrate ("wafer") W. More specifically, FIG. 9 depicts a portion of a stripe S on the reticle M and a corresponding region on the wafer W. The depicted region on the wafer W comprises multiple subfields SF each having a corresponding subfield RSF on the reticle M. The reticle subfields RSF are separated from one another in both the x-direction and the y-direction by respective light-shielding boundary zones BZ. Each boundary zone BZ includes a strut (not shown, but understood to extend along the respective boundary zone in the respective x- or y-direction). The struts collectively provide physical support for the reticle subfields RSF. The boundary zones BZ surrounding each reticle subfield RSF also function as a respective field stop.

Continuing further with FIG. 9, a charged particle beam B illuminates each of the reticle subfields RSF in a sequential manner. A portion of the charged particle beam B passes through the illuminated reticle subfield RSF. The portion passing through the illuminated reticle subfield has an ability to form an image of the illuminated reticle subfield on the wafer surface. A projection system comprising lenses PL1 and PL2 forms the image of the illuminated reticle subfield RSF on a corresponding subfield SF on the surface of the wafer W. The magnification imposed on the image by the projection system is usually negative, for example, −1/4. Therefore, the direction of motion of the reticle stage (not shown but understood to hold the reticle M) is opposite to the direction of motion of the wafer stage (not shown but understood to hold the wafer W) in the figure. For example, the wafer W is moved in the positive x-direction whenever the reticle M is moved in the negative x-direction, and the wafer W is moved stepwise in the positive y-direction whenever the reticle M is moved stepwise in the negative y-direction.

As discussed above, the reticle subfields RSF are separated from each other by respective boundary zones BZ. However, the corresponding subfields SF on the wafer W are contiguous. Therefore, if the magnification power of the projection system is −1/4, then the scanning velocity of the reticle stage is more than four times the scanning velocity of the wafer stage. For the same reason, the distance over which the reticle stage moves stepwise is more than four times the distance over which the wafer stage moves stepwise.

Thus, with conventional divided projection-exposure apparatus, each of the reticle subfields RSF is exposed as a single shot and all the reticle subfields RSF to be exposed are defined on the reticle. As a result, conventional divided projection-exposure apparatus achieve a significantly improved throughput compared to the conventional spot-beam exposure, variable-shaped-beam exposure, and block exposure systems. However, conventional divided projection-exposure apparatus require that the reticle pattern be divided into multiple subregions (e.g., subfields) and that transfer of the reticle pattern be performed subregion by subregion. Thus, the accuracy with which the projected subregions must be "stitched" together contiguously on the wafer surface is very high. Actual results achieved using conventional divided projection-exposure apparatus indicate that the required stitching accuracy is frequently not achieved, resulting in unwanted displacements of the projected subregions relative to each other.

Moreover, conventional divided projection-exposure apparatus generally exhibit a phenomenon called the "Coulomb effect". One type of Coulomb effect arises because the beam current passing through a reticle subfield RSF typically varies from subfield to subfield depending upon the feature density of each of the illuminated reticle subfields. Thus, the magnitude of such a Coulomb effect is typically different from one subfield to the next, resulting in a corresponding variation (from one subfield to the next) in the position along the z-axis of the focal point of the subfield images as projected onto the wafer W, and consequent blurring of the transferred images. To minimize this phenomenon, the projection system must be carefully controlled to ensure a constant focal length from one reticle subfield RSF to the next.

SUMMARY OF THE INVENTION

In view of the shortcomings of conventional methods and apparatus as summarized above, an object of the present invention to provide charged-particle-beam (CPB) exposure apparatus, and reticles for use with such apparatus, that reduce stitching displacements between adjacent reticle subfields as projected onto the substrate. Another object is to provide CPB exposure apparatus that reduce, by simple means, the variation in the focal point position from one projected reticle subfield to the next.

According to a first aspect of the invention, reticles are provided for use with a charged-particle-beam microlithographic exposure apparatus or method. A representative embodiment of such a reticle defines a reticle pattern corresponding to a pattern to be projection-transferred onto a sensitive substrate by CPB microlithography. The reticle pattern is divided into multiple reticle subregions separated from one another on the reticle. Each of at least two of the reticle subregions has a respective peripheral portion. The at least two reticle subregions are configured such that, when projection-transferred onto the substrate, the projection-transferred subregions are adjacent each other on the substrate with a region therebetween in which the respective peripheral portions overlap each other. Preferably, the reticle subregions are separated from each other on the reticle by respective light-shielding boundary regions.

According to an exemplary embodiment, the reticle pattern is divided into multiple reticle subregions separated from one another in a first direction by respective intervening boundary zones. Each reticle subregion comprises a center region flanked by first and second opposing junction regions that, when the reticle subregions are projection-transferred onto the sensitive substrate, are overlappingly shared with respective junction regions of adjacent projection-transferred subregions.

According to another exemplary embodiment, the reticle pattern is divided into multiple reticle subregions separated from one another in first and second perpendicular directions by respective intervening boundary zones. Each reticle subregion comprises a center region flanked by first and second opposing junction regions in the first direction, and first and second junction regions in the second direction. When the reticle subregions are projection-transferred onto the sensitive substrate, the first and second junction regions in the first direction are overlappingly shared with respective junction regions of adjacent projection-transferred subregions arrayed in the first direction, and the first and second junction regions in the second direction are overlappingly shared with respective junction regions of adjacent projection-transferred subregions arrayed in the second direction. The overlapping junction regions in the first and second directions cross each other at respective corner junctions such that each subregion as projection-transferred onto the sensitive substrate is flanked on all sides by overlapping junction regions and on all corners by overlapping corner junctions.

According to another aspect of the invention, CPB microlithographic exposure apparatus are provided. According to a representative embodiment, such an apparatus comprises an illumination system, a projection system, a reticle stage, a wafer stage, and a deflector. The apparatus also comprises a reticle defining a pattern to be projected onto a suitable substrate (e.g., a semiconductor wafer). The pattern on the reticle is divided into multiple reticle subregions separated from one another by respective intervening boundary zones, wherein each of at least two of the reticle subregions has respective peripheral portions. The illumination system is configured and situated so as to illuminate a charged particle beam onto a selected reticle subregion on the reticle. The projection system is configured and situated so as to form a pattern on a substrate by guiding the charged particle beam passing through the reticle to the substrate. The reticle stage is operable to hold the reticle and move the reticle in a stage-scanning direction perpendicular to a propagation direction of the charged particle beam illuminating the selected reticle subregion. The wafer stage is operable to hold the substrate and move the substrate in the stage-scanning direction. The deflector is configured and situated so as to deflect the charged particle beam in a beam-scanning direction perpendicular to the stage-scanning direction so as to projection-transfer the reticle subregions to corresponding locations on the substrate in a manner by which the at least two reticle subregions, when projection-transferred onto the substrate, are adjacent each other on the substrate with a region therebetween in which the respective peripheral portions overlap each other.

In the foregoing apparatus, the reticle pattern can be divided into multiple reticle subregions separated from one another in the stage-scanning direction by respective boundary zones. In such a configuration, each reticle subregion comprises a center region flanked by first and second opposing junction regions that, when the reticle subregions are projection-transferred onto the substrate, are overlappingly shared with respective junction regions of adjacent projection-transferred subregions. The charged particle beam as projected onto the reticle has a width, in the beam-scanning direction, that is constant within each center region and that decreases linearly to zero in each junction region.

Also with respect to the foregoing apparatus, the reticle pattern can be divided into multiple reticle subregions separated from one another in the stage-scanning direction and in the beam-scanning direction by respective boundary zones. Each reticle subregion comprises a center region flanked by first and second opposing junction regions in the stage-scanning direction, and first and second junction regions in the second direction. When the reticle subregions are projection-transferred onto the substrate, the first and second junction regions in the stage-scanning direction are overlappingly shared with respective junction regions of adjacent projection-transferred subregions arrayed in the stage-scanning direction, and the first and second junction regions in the beam-scanning direction are overlappingly shared with respective junction regions of adjacent projection-transferred subregions arrayed in the beam-scanning direction. The overlapping junction regions in the stage-scanning and beam-scanning directions cross each other at respective corner junctions such that each subregion as projection-transferred onto the substrate is flanked on all sides by overlapping junction regions and on all corners by overlapping corner junctions. The charged particle beam as projected onto the reticle has a width, in the beam-scanning direction, that is constant within each center region and that decreases linearly to zero in each junction region.

The charged particle beam can have an illumination field as the beam illuminates the selected reticle subregion. The charged particle beam passing through any selected reticle subfield preferably has a constant illumination intensity. In an alternative configuration, the illumination field is divided into multiple illumination zones.

Using a reticle and/or apparatus according to the invention, because adjacent subregions as projected onto the substrate are joined together have a common region therebetween, stitching errors at the junction are significantly reduced compared to conventional practice.

Moreover, in the above-described CPB exposure apparatus, the width of the illumination field in the beam-scanning direction can be variable. With such a configuration, the beam current passing through the illumination field is made essentially constant from subregion to subregion. As a result, Coulomb effects are rendered substantially uniform from subregion to subregion, and consequential variations in the displacement of the focal-point position of the beam from subregion to subregion are maintained constant, which is much easier to correct than a varying focal-point position. The result of such an improvement is substantially reduced blur of the transferred image conventional practice.

Moreover, in the above-described CPB exposure apparatus, by dividing the illumination field into multiple illumination subregions, the area of each illumination subregion is kept small, which minimizes Coulomb effects. This, in turn, further reduces blur of the transferred image.

The foregoing and additional features and advantages of the invention will be more readily apparent from the following detailed description, which proceeds with reference to the accompanying drawings.

DETAILED DESCRIPTION

Figure 1:
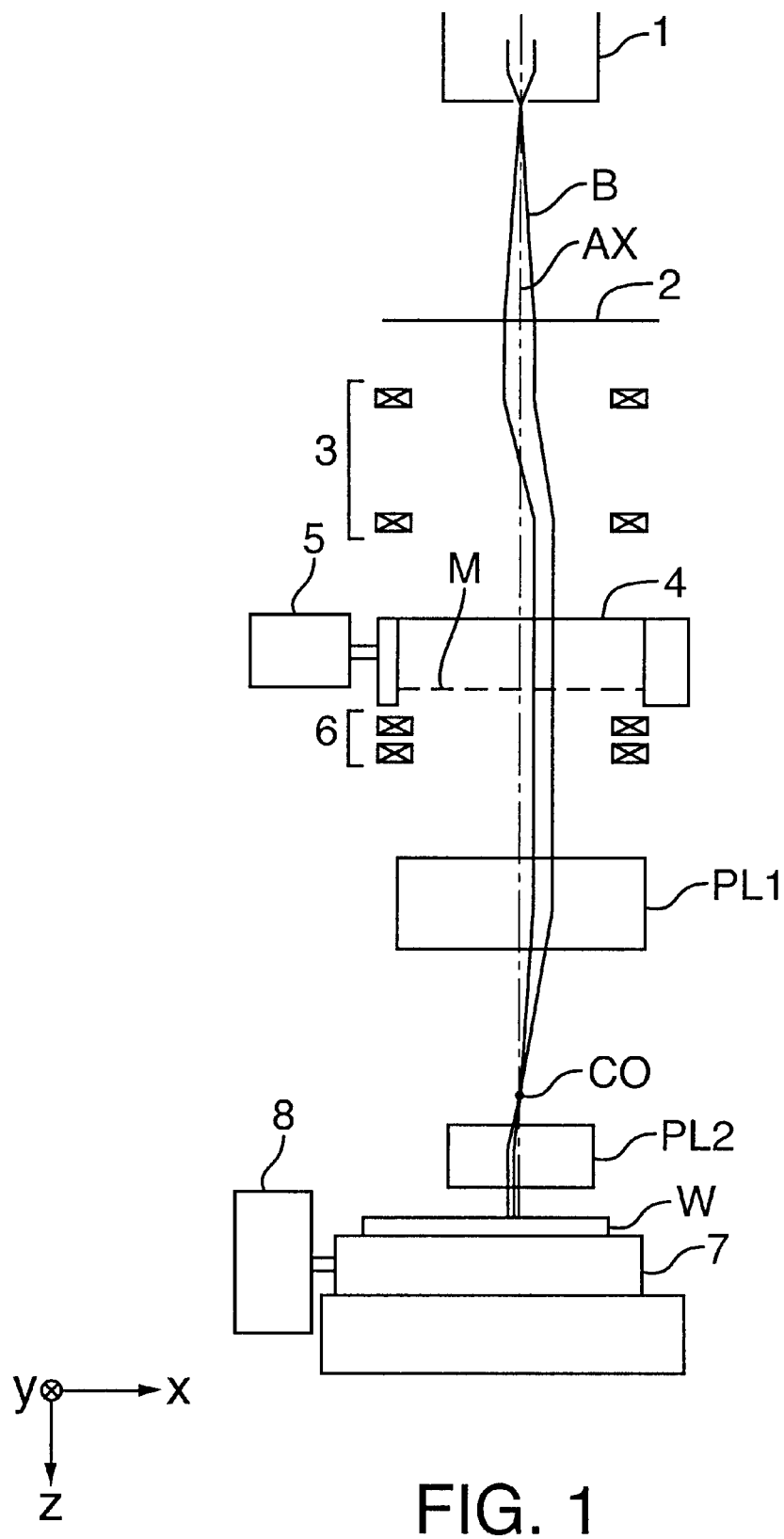
FIG. 1 is an elevational schematic drawing of a representative embodiment of a charged-particle-beam (CPB) microlithographic exposure apparatus according to the invention.

A representative embodiment of a charged-particle-beam (CPB) transfer-exposure apparatus (microlithographic apparatus) according to the invention. The FIG. 1 embodiment includes various components, as described below, situated along an optical axis AX. A charged particle beam (e.g., electron beam) B is produced by a CPB source 1 (e.g., electron gun). The beam B, propagating along the axis AX, is collimated by passage through a condenser lens 2. A subregion-selection deflector 3 deflects the collimated beam in an x-y plane (a horizontal plane perpendicular to the plane of the figure) to a particular subregion on a reticle M so as to illuminate the selected subregion. The reticle M is situated parallel to the x-y plane by a reticle stage 4. The reticle stage 4 is controllably actuated by a reticle-stage driver 5 operable to scan-shift the reticle stage 4 in the x-direction and step-shift the reticle stage 4 in the y-direction. The reticle M defines a pattern (divided into multiple subregions) to be microlithographically transferred to a substrate ("wafer") W. The charged particle beam B that has passed through the illuminated subregion on the reticle M is deflected a prescribed amount by a deflector 6. A first projection lens PL1 converges the charged particle beam B at an axial crossover CO. A second projection lens PL2 transfers the charged particle beam B to a prescribed location on the wafer W. The first and second projection lenses PL1, PL2 collectively constitute a projection system that projects onto the wafer W a demagnified image of the illuminated reticle subregion, by which is meant that the image formed on the wafer W is smaller than the corresponding illuminated subregion on the reticle. (An exemplary demagnification ratio is 1/4.) The wafer W is mounted on a wafer stage 7 parallel to the x-y plane. The wafer stage 7 is controllably actuated by a wafer-stage driver 8 operable to scan-shift the wafer stage in the x-direction and step-shift the wafer stage in the y-direction.

Figure 2:
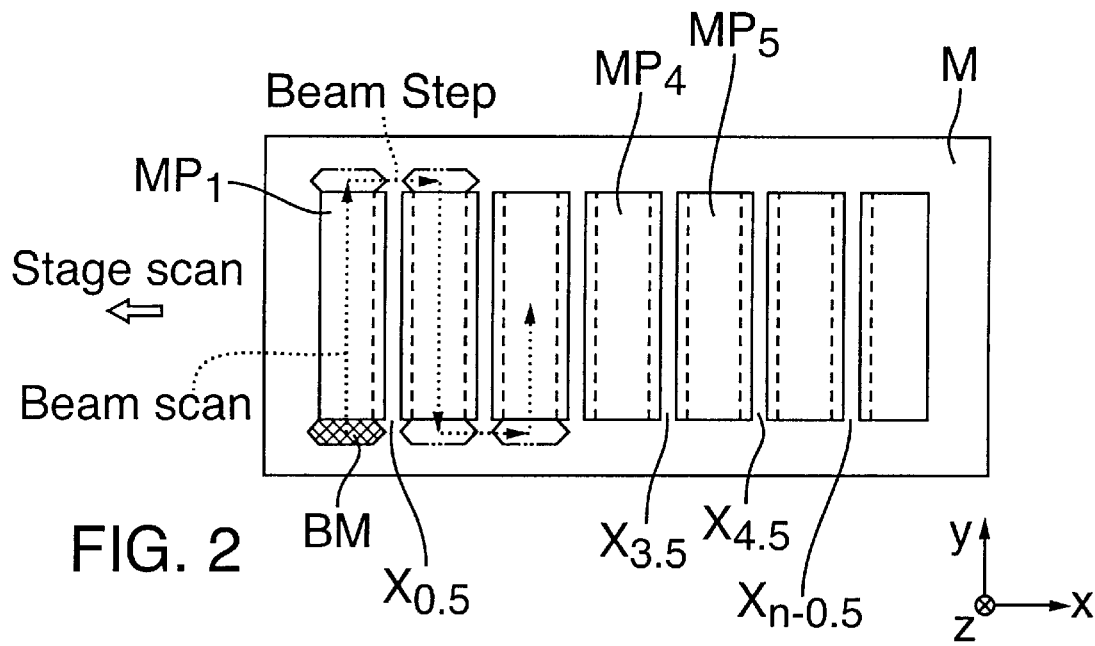
FIG. 2 is a schematic plan view of a first representative embodiment of a reticle M according to the invention.
Figure 3:
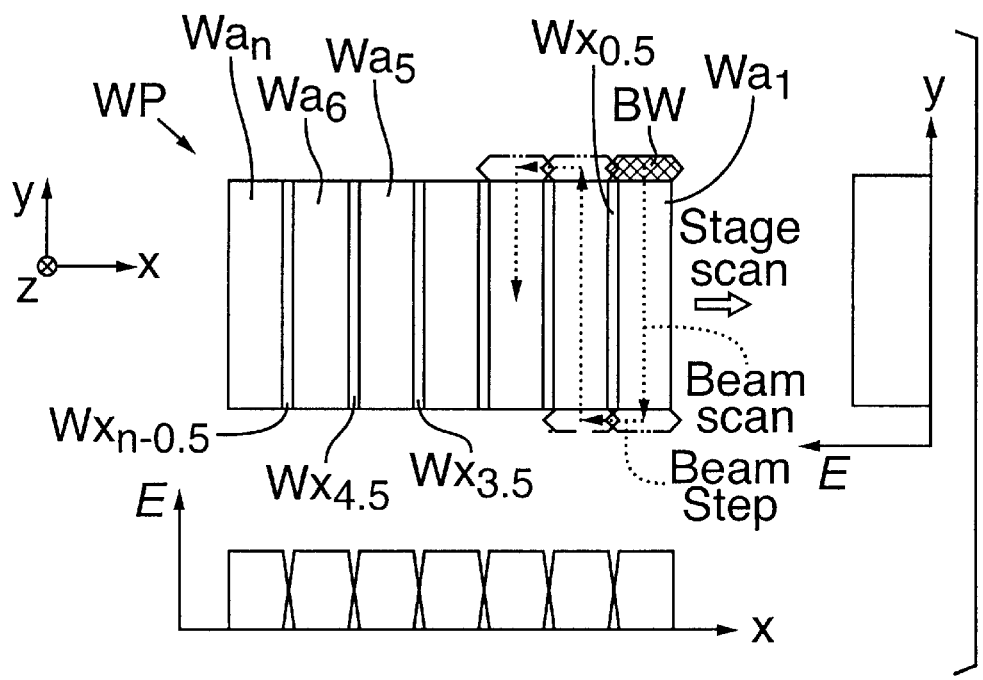
FIG. 3 is a schematic plan view of a wafer W being exposed using the reticle of FIG. 2.

A portion of a first embodiment of a reticle M, according to the invention and usable with the FIG. 1 apparatus, is depicted in FIG. 2. A corresponding portion of a wafer W being microlithographically exposed using the FIG. 2 reticle is shown in FIG. 3. Referring to FIG. 2, the pattern defined by the reticle M is divided among multiple reticle subregions $MP_1$–$MP_n$ sequentially arrayed in the x-direction. The reticle subregions are separated from each other in the x-direction by boundary zones $X_{0.5}$–$X_{n-0.5}$.

FIG. 3 shows the pattern WP (corresponding to the reticle pattern shown in FIG. 2) as transferred onto the wafer W. As projected onto the wafer W, the pattern WP comprises multiple "center" regions $Wa_1$–$Wa_n$ (corresponding to the reticle subregions $MP_1$–$MP_n$) arrayed in the x-direction. "Junction" regions $Wx_{0.5}$–$Wx_{n-0.5}$ are situated between respective center regions. All the center regions $Wa_1$–$Wa_n$ have the same width in the x-direction, and all the junction regions $Wx_{0.5}$–$Wx_{n-0.5}$ have the same width in the x-direction.

The center regions $Wa_1$–$Wa_n$ on the wafer correspond to the reticle subregions $MP_1$–$MP_n$, respectively. The junction regions $Wx_{0.5}$–$Wx_{n-0.5}$ on the wafer correspond to the boundary zones $X_{0.5}$–$X_{n-0.5}$, respectively, on the reticle M. Thus, for example, the reticle subregions $MP_i$ and $MP_{i+1}$, when projected onto the wafer, share the junction region $Wx_{i+0.5}$. That is, the pattern portion defined by the edge of the reticle subregion $MP_i$ flanking the reticle subregion $MP_{i+1}$ is identical to the pattern portion defined on the edge of the reticle subregion $MP_{i+1}$ flanking the reticle subregion $MP_i$.

As shown in FIG. 3, the width (in the y-direction) of the exposure field BW of the charged particle beam as incident on the wafer is constant within each individual center region $Wa_i$. The width decreases linearly to zero within each junction region $Wx_{i+0.5}$. During transfer of the pattern from the reticle to the wafer, the charged particle beam is scanned across the pattern WP in the y-direction and is step-shifted in the x-direction.

As shown in FIG. 2, the y-direction width of the illumination field BM of the charged particle beam as incident on the reticle is also constant in the center region of each reticle subregion $MP_i$. The width decreases linearly to zero along each edge of the reticle subregion $MP_i$. The charged particle beam is scanned across the subregion $MP_i$ in the y-direction and is step-shifted in the x-direction.

This representative embodiment is configured such that the charged particle beam is scanned in the y-direction. Hence, the intensity distribution of the CPB illumination energy E in the y-direction on the wafer pattern WP is substantially constant as shown in the right-hand portion of FIG. 3. The y-direction width of the exposure field BW of the charged particle beam as incident on the pattern WP is constant within each center region $Wa_i$ and decreases linearly to zero within each flanking junction region $Wx_{i+0.5}$. Also, junction regions adjacent each other actually overlap each other when they are exposed. As a result, the distribution of illumination energy E of the charged particle beam in the x-direction on the pattern WP is constant as shown in the bottom portion of FIG. 3. Thus, adjacent reticle subregions $MP_i$ and $MP_{i+1}$ as projected onto the wafer are connected together at a common junction region, and any error at the junction of the adjacent subregions $MP_i$ and $MP_{i+1}$ as projected onto the wafer is significantly reduced compared to conventional practice.

Figure 4:
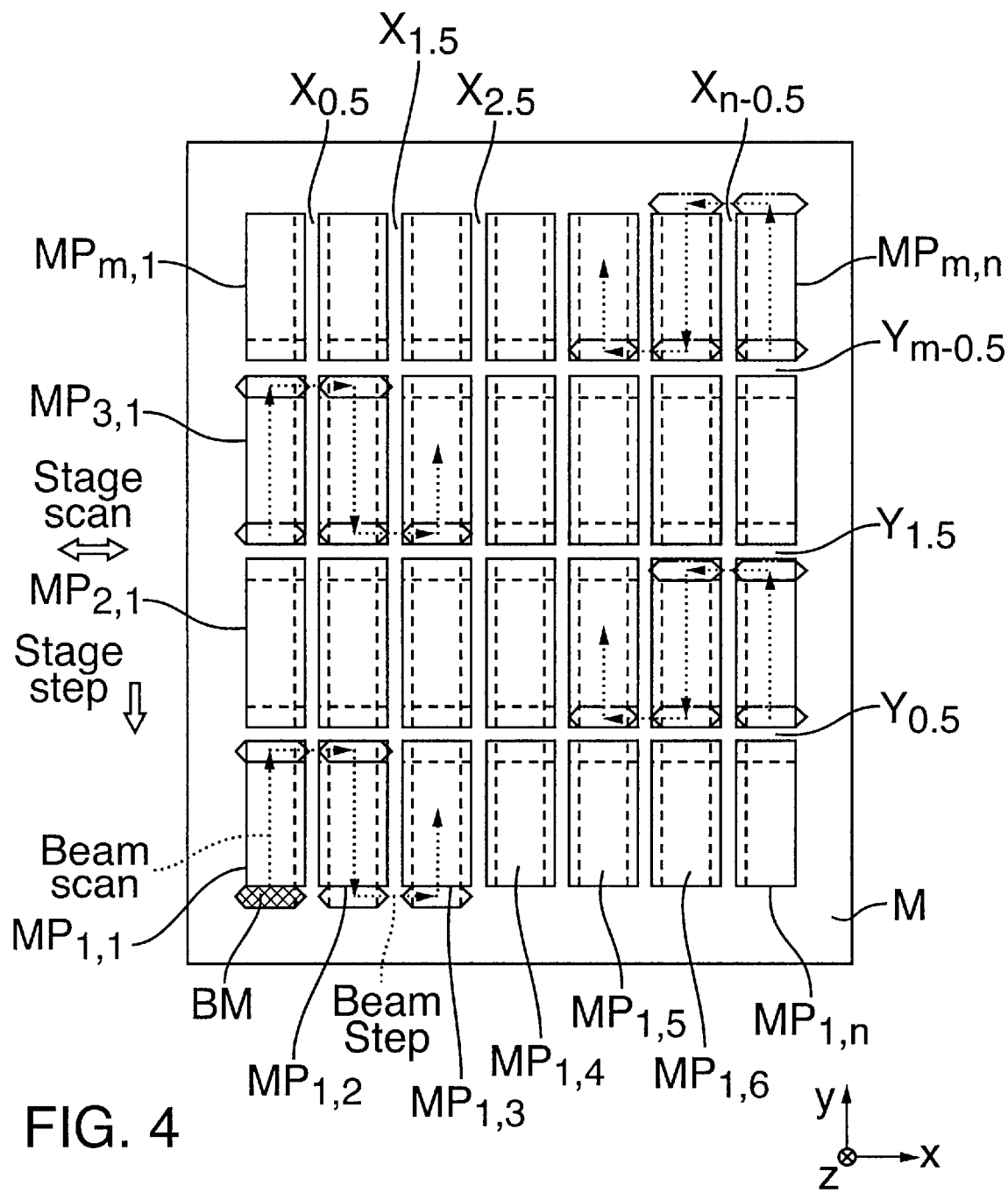
FIG. 4 is a schematic plan view of a second representative embodiment of a reticle M according to the invention.
Figure 5:
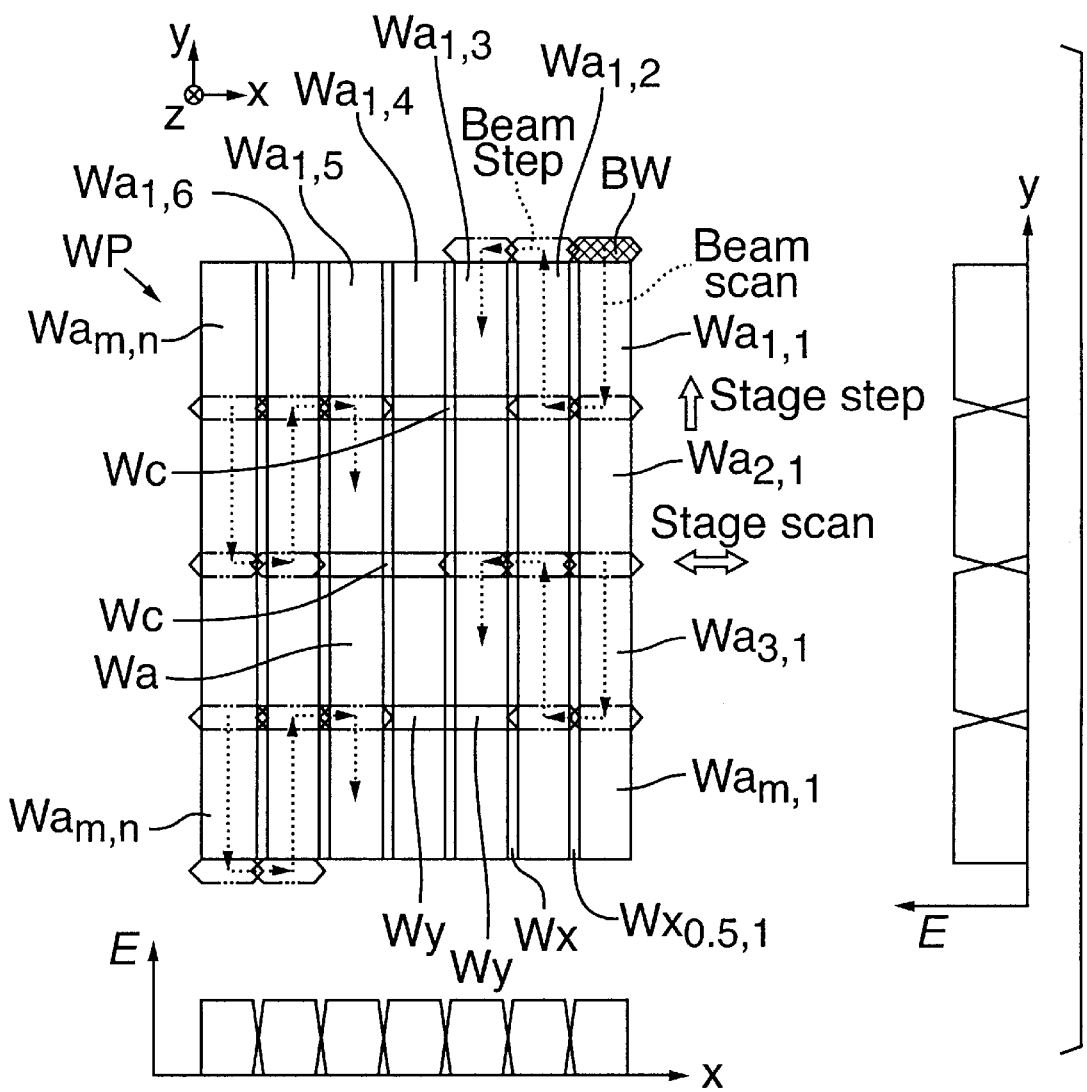
FIG. 5 is a schematic plan view of a wafer W being exposed using the reticle of FIG. 4.

FIG. 4 depicts a second representative embodiment of a reticle M usable with the apparatus of FIG. 1, and FIG. 5 depicts a wafer W exposed using the FIG. 4 reticle M. As shown in FIG. 4, the pattern formed on the reticle M is divided into multiple reticle subregions $MP_{1,1}$–$MP_{m,n}$ arranged in the form of an m×n matrix. The n columns of these subregions are separated from each other in the x-direction by intervening x-direction boundary zones $X_{0.5}$–$X_{n-0.5}$. The m rows of these subregions are separated from each other in the y-direction by intervening y-direction boundary zones $Y_{0.5}$–$Y_{m-0.5}$.

Turning to FIG. 5, the pattern WP transferred onto the wafer W comprises multiple "center" regions $Wa_{1,1}$–$Wa_{m,n}$ arranged in the form of an m×n matrix. The pattern WP also includes x-direction junction regions $Wx_{0.5,1}$–$Wx_{n-0.5,m}$ that separate the center regions $Wa_{1,1}$–$Wa_{n,m}$ in the x-direction, y-direction junction regions $Wy_{1,0.5}$–$Wy_{n,m-0.5}$ that separate the center regions $Wa_{1,1}$–$Wa_{m,n}$ in the y-direction, and corner junction regions $Wc_{0.5,0.5}$–$Wc_{n-0.5,m-0.5}$ that are formed at respective intersections of the x-direction junction regions $Wx_{i+0.5,j}$ and the y-direction junction regions $Wy_{i,j+0.5}$ for all $1 \leq i \leq n$ and for all $1 \leq j \leq m$. All the center regions $Wa_{1,1}$–$Wa_{m,n}$ have the same x-direction width and the same y-direction width. The x-direction junction regions $Wx_{i+0.5,j}$ have the same x-direction width for all $1 \leq i \leq n$ and for all $1 \leq j \leq m$. The y-direction junction regions $Wy_{i,j+0.5}$ have the same y-direction width for all $1 \leq i \leq n$ and for all $1 \leq j \leq m$.

The reticle subregions $MP_{i,j}$ (FIG. 4) are configured and positioned so as to correspond to the respective center regions $Wa_{i,j}$ on the pattern WP (FIG. 5), the x-direction junction regions $Wx_{i-0.5,j}$ formed on the left of each center region $Wa_{i,j}$, the x-direction junction regions $Wx_{i+0.5,j}$ formed on the right of each center region $Wa_{i,j}$, the y-direction junction regions $Wy_{i,j-0.5}$ formed "before" $Wa_{i,j}$, the y-direction junction regions $Wy_{i,j+0.5}$ formed "after" $Wa_{i,j}$, and the corner junction regions $Wc_{i-0.5,j-0.5}$, $Wc_{i-0.5,j+0.5}$, $Wc_{i+0.5,j-0.5}$, and $Wc_{i+0.5,j+0.5}$ for all $1 \leq i \leq n$ and for all $1 \leq j \leq m$.

Thus, each reticle subregion $MP_{i,j}$ is configured and positioned so that its peripheral portions in the x-direction and y-direction will share the junction regions $Wx_{i-0.5,j}$, $Wx_{i+0.5,j}$, $Wy_{i,j-0.5}$, $Wy_{i,j+0.5}$, $Wc_{i-0.5,j-0.5}$, $Wc_{i-0.5,j+0.5}$, $Wc_{i+0.5,j-0.5}$, and $Wc_{i+0.5,j+0.5}$ for all $1 \leq i \leq n$ and for all $1 \leq j \leq m$.

Moreover, as shown in FIG. 5, the y-direction width of the exposure field BW of the charged particle beam on the pattern WP is constant over each center region $Wa_{i,j}$, and decreases linearly to zero within the flanking x-direction junction regions $Wx_{i-0.5,j}$ and $Wx_{i+0.5,j}$ for all $1 \leq i \leq n$ and for all $1 \leq j \leq m$. The charged particle beam scans the substrate pattern WP in the y-direction and is step-shifted in the x-direction. Similarly, as shown in FIG. 4, the y-direction width of the illumination field BM of the charged particle beam on the reticle is constant within the center portion of each reticle subregion $MP_{i,j}$, and decreases linearly to zero along both edges of each reticle subregion $MP_{i,j}$ for all $1 \leq i \leq n$ and for all $1 \leq j \leq m$. The charged particle beam scans the reticle subregion $MP_{i,j}$ in the y-direction and is step-shifted in the x-direction for all $1 \leq i \leq n$ and for all $1 \leq j \leq m$.

Since the embodiment of FIGS. 4 and 5 is configured in the manner described above, the charged particle beam scans each reticle subregion $MP_{i,j}$ in the y-direction from the y-direction junction region $Wy_{i,j-0.5}$ to the y-direction junction region $Wy_{i,j+0.5}$, for all $1 \leq i \leq n$ and for all $1 \leq j \leq m$. As a result, the distribution of illumination energy E of the charged particle beam in the y-direction from the y-direction junction region $Wy_{i,j-0.5}$ to the y-direction junction region $Wy_{i,j+0.5}$ decreases linearly to zero within $Wy_{i,j-0.5}$ and $Wy_{i,j+0.5}$ for all $1 \leq i \leq n$ and for all $1 \leq j \leq m$. However, since adjacent y-direction junction regions overlap each other after exposure, the distribution of illumination energy E of the charged particle beam in the y-direction on the pattern WP is uniform as shown in the right-hand portion of FIG. 5.

The y-direction width of the exposure field BW of the charged particle beam on the pattern WP is constant within the center region $Wa_{i,j}$ and decreases linearly to zero in the x-direction junction regions $Wx_{i-0.5,j}$ and $WX_{i+0.5,j}$ for all $1 \leq i \leq n$ and for all $1 \leq j \leq m$. Moreover, adjacent junction regions overlap each other when they are exposed. Therefore, the distribution of illumination energy E of the charged particle beam in the x-direction on the pattern WP is uniform as shown in the bottom portion of FIG. 5.

Thus, any pair of adjacent subregions as projected on the wafer is connected together with a common intervening x-direction junction region or a common y-direction junction region. As a result, errors at the junction of any pair of adjacent subregions are significantly reduced compared to conventional practice.

Figure 10:
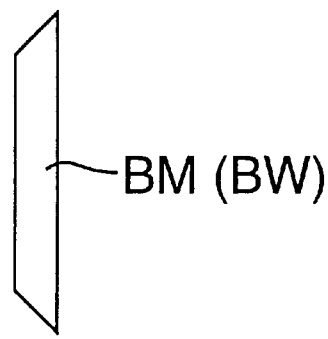
FIG. 10 is a plan view of a third representative embodiment of the illumination field or exposure field of the charged particle beam.

In the above-described embodiments, the transverse profile of the illumination field of the charged particle beam is preferably as shown in FIG. 2. Alternatively, the illumination field may have any other suitable transverse profile, provided that the illumination intensity distribution in each center region will be equal to the illumination intensity distribution in each junction region as projected on the wafer. For example, the illumination field may have a transverse profile as shown in FIG. 10.

Figure 8A:
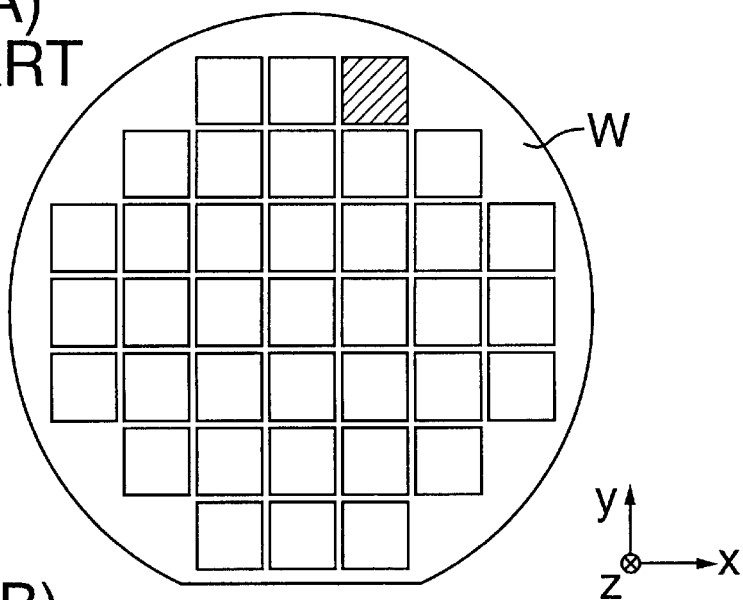
FIG. 8(A) is a plan view of a conventional wafer including multiple dies.
Figure 8B:
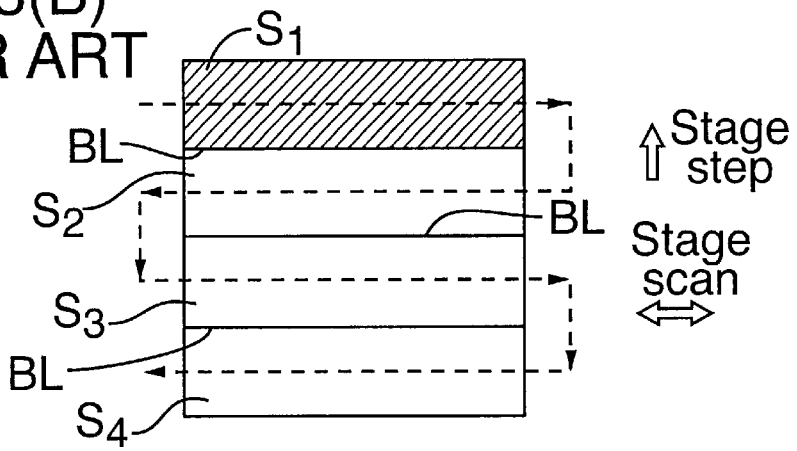
FIG. 8(B) is a plan view illustrating sequential exposure according to conventional practice.
Figure 8C:
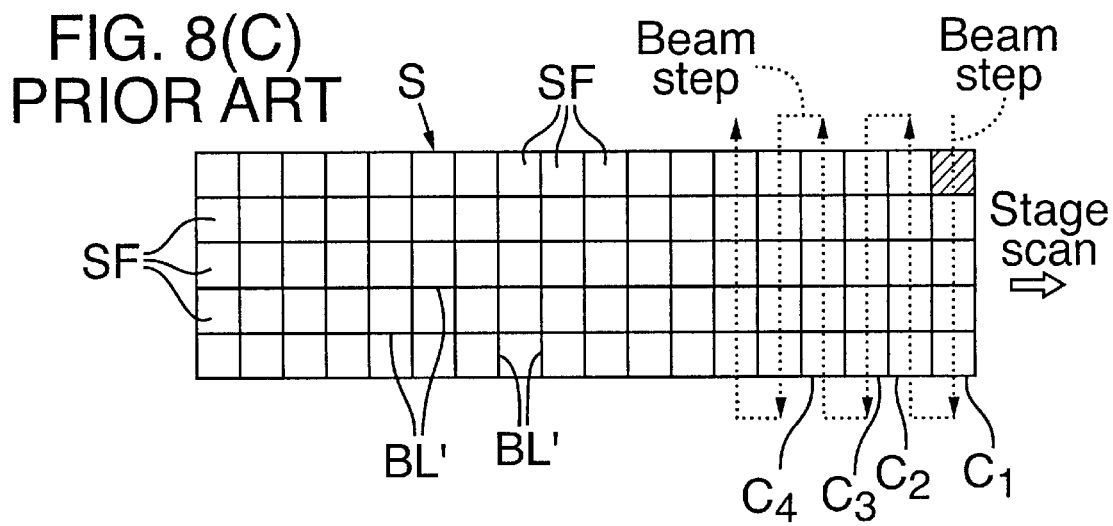
FIG. 8(C) is a plan view illustrating sequential exposure, according to conventional practice, of subfields of a stripe on a wafer.
Figure 9:
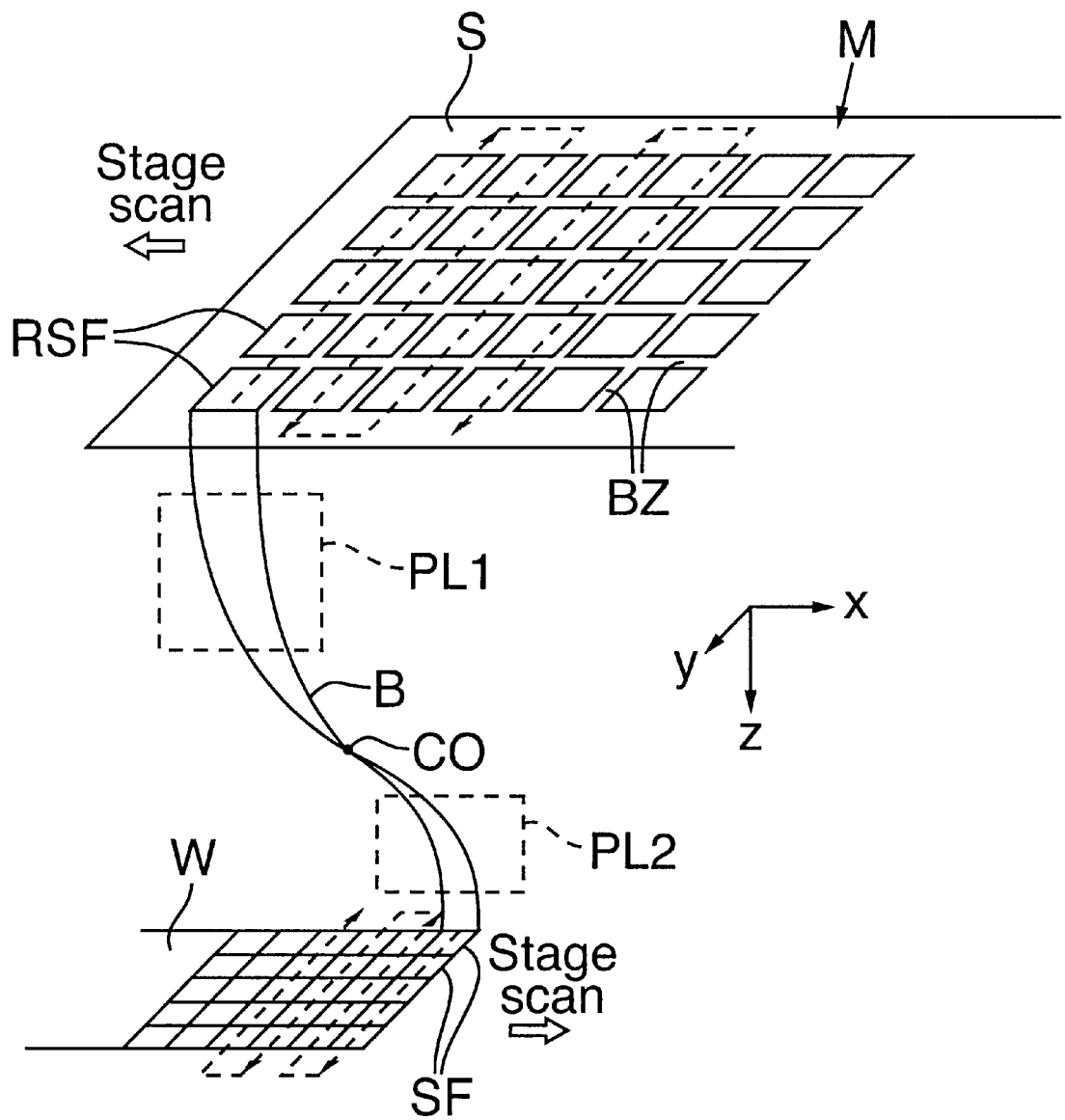
FIG. 9 is an oblique view showing the relation between the reticle, wafer, and charged particle beam according to the prior art.
Figure 11:
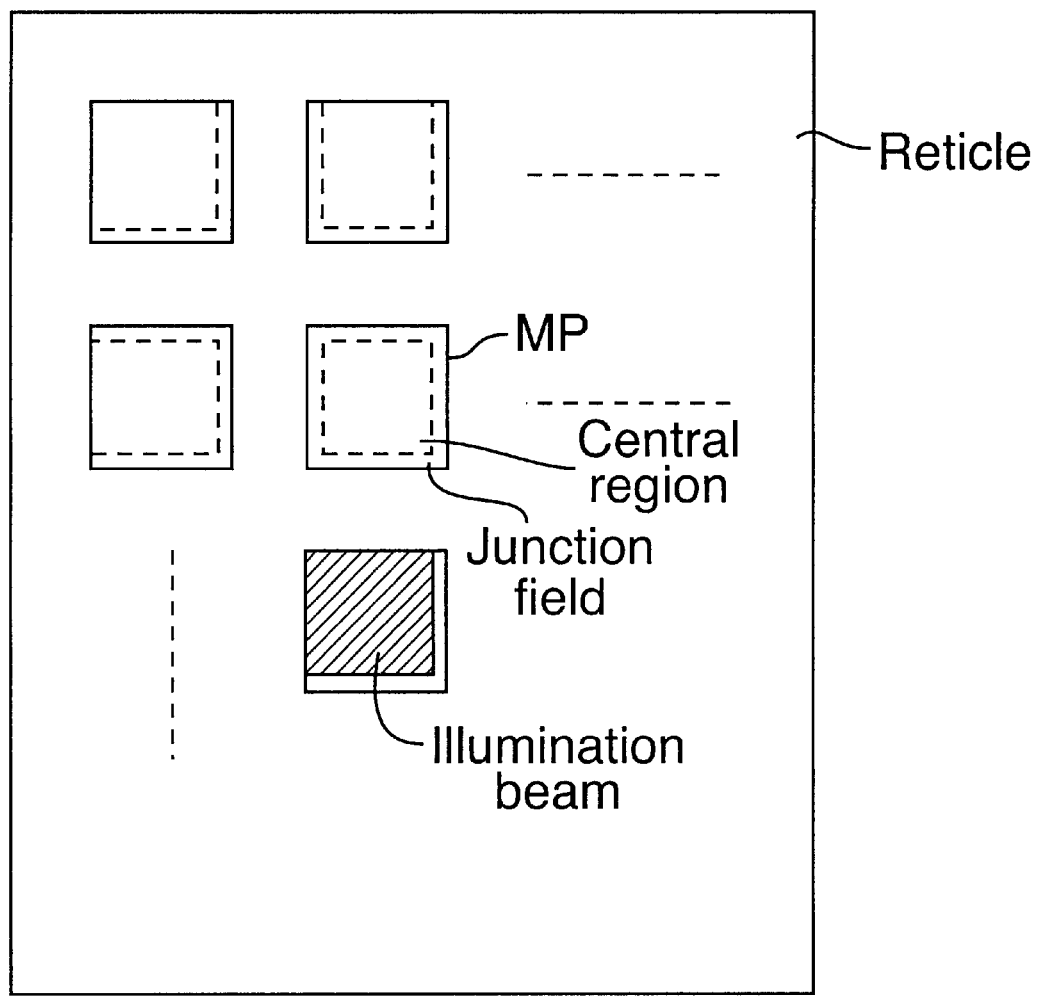
FIG. 11 is a plan view of another embodiment of a reticle according to the invention.

In the above-described embodiments, each reticle subregion is scanned with an illumination field having a prescribed profile. However, the present invention can be applied to an exposure apparatus based on the divided projection-transfer system shown in FIGS. 8 and 9. As shown in FIG. 11, each reticle subregion $MP_i$ of a reticle used in such an exposure apparatus has a central region and flanking junction regions in which the respective pattern portions are shared with adjacent reticle subregions. The charged particle beam illuminated on the reticle is preferably oscillated in the x-direction and the y-direction in addition to the standard exposure scheme of the divided projection-transfer system. As a result, the distribution of illumination energy on the wafer is substantially constant. That is, the charged particle beam having a transverse profile as denoted by the shaded region in FIG. 11 is deflected rapidly and minutely in the x-direction and in the y-direction. This type of deflection can be achieved by changing the signal input to the subregion-selection deflector 3 (FIG. 1). Alternatively, a special deflector may be installed to achieve this type of deflection.

Figure 6A:
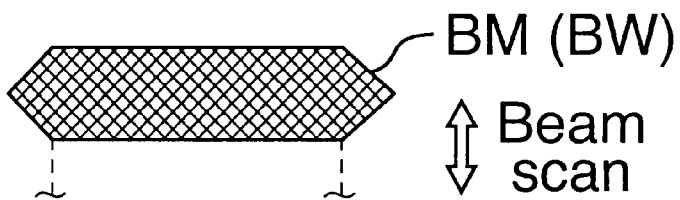
FIGS. 6(A)–6(C) are schematic plan views of an alternative embodiment of the illumination field or exposure field of the charged particle beam, in which the illumination field or exposure field has a variable transverse profile.
Figure 6B:
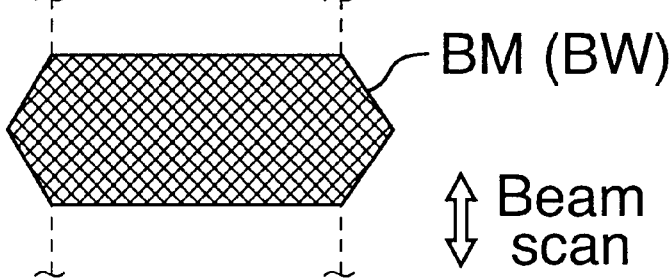
Figure 6C:
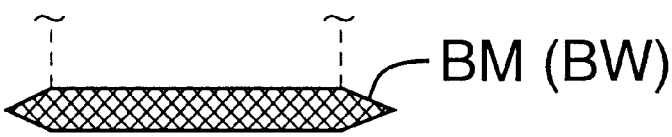

FIGS. 6(A)–6(C) depict an alternative embodiment of an illumination field BM or exposure field BW of the charged particle beam. In the first and second embodiments described above, the transverse profile of the illumination field BM or exposure field BW of the charged particle beam was fixed. However, in the embodiment of FIGS. 6(A)–6(C), the profile of the illumination field BM or exposure field BW of the charged particle beam is freely expanded or contracted in the scanning direction of the beam. As a result, the degree of image blur generated by the Coulomb effect can be significantly reduced compared to conventional practice.

FIG. 6(A) shows the transverse profile of the illumination field BM or exposure field BW whenever the feature density of the portion of the reticle pattern to be transferred is approximately normal. FIG. 6(B) shows the transverse profile of the illumination field BM or exposure field BW whenever the feature density of the portion of the reticle pattern to be transferred is significantly less than normal. FIG. 6(C) depicts the profile of the illumination field BM or exposure field BW whenever the feature density of the portion of the reticle pattern to be transferred is significantly greater than normal.

By contracting or expanding the profile of the illumination field BM or exposure field BW in the beam-scanning direction, the distribution of illumination energy can be maintained substantially constant as required. As a result, the magnitude of image blur generated by the Coulomb effect can be significantly reduced.

Since the feature density in each portion of the reticle pattern is known, the width (in the beam-scanning direction) of the illumination field BM or exposure field BW required to keep the illumination energy E substantially constant can be calculated easily.

Figure 7:
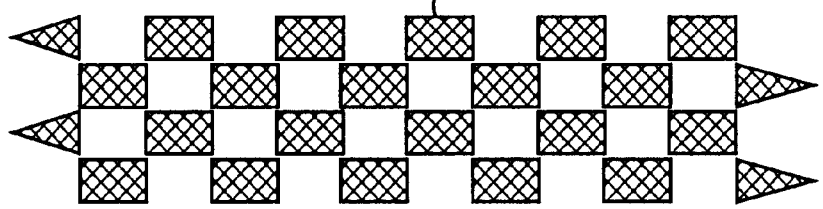
FIG. 7 is a schematic plan view of another alternative embodiment of the illumination field or exposure field of the charged particle beam.

FIG. 7 depicts yet another alternative embodiment of the illumination field BM or exposure field BW of the charged particle beam. In this embodiment, the illumination field BM as incident on the reticle is divided into multiple illumination zones BMa and the exposure field BW of the charged particle beam as incident on the wafer is divided into multiple exposure zones BWa. With such a configuration, the illumination energy within each zone can be kept low. As a result, the degree of image blur generated by the Coulomb effect can be significantly reduced.

CPB microlithographic exposure apparatus and reticles, according to the present invention, reduce displacements at junctions between adjacent reticle subregions. Moreover, a CPB exposure apparatus according to the present invention is able to easily reduce a displacement of the focal-point position for each reticle subregion.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A reticle for a charged-particle-beam microlithographic exposure apparatus, comprising:

(a) a reticle pattern defined on the reticle, the reticle pattern corresponding to a pattern to be projection-transferred onto a sensitive substrate;

(b) the reticle pattern being divided into multiple reticle subregions separated from one another on the reticle by multiple boundary zones; and (c) each of at least two of the reticle subregions having a respective peripheral portion, the at least two reticle subregions being configured such that, when projection-transferred onto the substrate, the projection-transferred subregions are adjacent each other on the substrate with a region therebetween in which the respective peripheral portions overlap each other.

2. The reticle of claim 1, wherein respective peripheral portions of respective reticle subregions define substantially identical portions of the reticle pattern.

3. The reticle of claim 1, wherein:

the reticle pattern is divided into multiple reticle subregions separated from one another in a first direction by respective intervening boundary zones; and each reticle subregion comprises a center region flanked by first and second opposing junction regions that, when the reticle subregions are projection-transferred onto the sensitive substrate, are overlappingly shared with respective junction regions of adjacent projection-transferred subregions.

4. The reticle of claim 1, wherein:

the reticle pattern is divided into multiple reticle subregions separated from one another in a first direction and a second direction by respective intervening boundary zones;

each reticle subregion comprises a center region flanked by a first opposing junction region and a second opposing junction region in the first direction, and first and second junction regions in the second direction; and wherein, when the reticle subregions are projection-transferred onto the sensitive substrate, the first and second opposing junction regions in the first direction are overlappingly shared with respective opposing junction regions of adjacent projection-transferred subregions arrayed in the first direction, and the first and second junction regions in the second direction are overlappingly shared with respective junction regions of adjacent projection-transferred subregions arrayed in the second direction, the overlapping junction regions in the first and second directions crossing each other at respective corner junctions such that each subregion as projection-transferred onto the sensitive substrate is flanked on all sides by overlapping junction regions and on all corners by overlapping corner junctions.

5. A charged-particle-beam microlithographic exposure apparatus, comprising:

(a) a reticle defining a pattern, the pattern on the reticle being divided into multiple reticle subregions separated from one another by respective intervening boundary zones, each of at least two of the reticle subregions having a respective peripheral portions;

(b) an illumination system configured and situated so as to illuminate a charged particle beam onto a selected reticle subregion on the reticle;

(c) a projection system configured and situated so as to form a pattern on a substrate by guiding the charged particle beam passing through the reticle to the substrate;

(d) a reticle stage operable to hold the reticle and move the reticle in a stage-scanning direction perpendicular to a propagation direction of the charged particle beam illuminating the selected reticle subregion;

(e) a wafer stage operable to hold the substrate and move the substrate in the stage-scanning direction; and (f) a deflector configured and situated so as to deflect the charged particle beam in a beam-scanning direction perpendicular to the stage-scanning direction so as to projection-transfer the reticle subregions to corresponding locations on the substrate in a manner by which the at least two reticle subregions, when projection-transferred onto the substrate, are adjacent each other on the substrate with a region therebetween in which the respective peripheral portions overlap each other.

6. The apparatus of claim 5, wherein:

the reticle pattern is divided into multiple reticle subregions separated from one another in the stage-scanning direction by respective boundary zones;

each reticle subregion comprises a center region flanked by first and second opposing junction regions that, when the reticle subregions are projection-transferred onto the substrate, are overlappingly shared with respective junction regions of adjacent projection-transferred subregions; and the charged particle beam as projected onto the reticle has a width, in the beam-scanning direction, that is constant within each center region and that decreases linearly to zero in each junction region.

7. The apparatus of claim 5, wherein:

the reticle pattern is divided into multiple reticle subregions separated from one another in the stage-scanning direction and in the beam-scanning direction by respective boundary zones;

each reticle subregion comprises a center region flanked by first and second opposing junction regions in the stage-scanning direction, and first and second junction regions in the second direction such that, when the reticle subregions are projection-transferred onto the substrate, the first and second opposing junction regions in the stage-scanning direction are overlappingly shared with respective opposing junction regions of adjacent projection-transferred subregions arrayed in the stage-scanning direction, and the first and second junction regions in the beam-scanning direction are overlappingly shared with respective junction regions of adjacent projection-transferred subregions arrayed in the beam-scanning direction, the overlapping junction regions in the stage-scanning and beam-scanning directions crossing each other at respective corner junctions such that each subregion as projection-transferred onto the substrate is flanked on all sides by overlapping junction regions and on all corners by overlapping corner junctions; and the charged particle beam as projected onto the reticle has a width, in the beam-scanning direction, that is constant within each center region and that decreases linearly to zero in each junction region.

8. The apparatus of claim 5, wherein the charged particle beam has an illumination field as the beam illuminates the selected reticle subregion, the illumination field having a width in the beam-scanning direction, wherein the width is variable.

9. The apparatus of claim 8, wherein the width of the charged particle beam illuminated onto any selected reticle subregion is expanded or contracted based on a reticle pattern feature density of the selected reticle subregion such that the charged particle beam passing through the selected reticle subregion illuminates the substrate with a constant illumination intensity.

10. The apparatus of claim 5, wherein the charged particle beam has an illumination field as the beam illuminates the selected reticle subregion, the illumination field being divided into multiple illumination zones.

11. A charged-particle-beam microlithographic exposure apparatus, comprising:

(a) a reticle defining a pattern, the pattern on the reticle being divided into multiple reticle subregions separated from one another by respective intervening boundary zones, each of at least two of the reticle subregions having a respective peripheral portions;

(b) an illumination system configured and situated so as to illuminate a charged particle beam onto a selected reticle subregion on the reticle, wherein the charged particle beam has an illumination field as the beam illuminates the selected reticle subregion, the illumination field having a variable width in a beam-scanning direction;

(c) a projection system configured and situated so as to form a pattern on a substrate by guiding the charged particle beam passing through the reticle to the substrate;

(d) a reticle stage operable to hold the reticle and move the reticle in a stage-scanning direction perpendicular to a propagation direction of the charged particle beam illuminating the selected reticle subregion;

(e) a wafer stage operable to hold the substrate and move the substrate in the stage-scanning direction; and (f) a deflector configured and situated so as to deflect the charged particle beam in a beam-scanning direction perpendicular to the stage-scanning direction so as to projection-transfer the reticle subregions to corresponding locations on the substrate, wherein the projection-transferred subregions are adjacent each other on the substrate with a region therebetween in which the respective peripheral portions overlap each other.

12. The apparatus of claim 11, wherein the illumination system generates a charged particle beam having an illumination field, the illumination field having a width less than the width of a selected reticle subregion to be illuminated.

13. The apparatus of claim 11, wherein the illumination system is configured to scan the charged particle beam across the width of the selected reticle subregion a plurality of times during a course of an exposure period.

14. A charged-particle-beam microlithographic exposure apparatus, comprising:

(a) a reticle defining a pattern, the pattern on the reticle being divided into multiple reticle subregions separated from one another by respective intervening boundary zones, each of at least two of the reticle subregions having respective peripheral portions;

(b) an illumination system configured and situated so as to illuminate a charged particle beam onto a selected reticle subregion on the reticle, wherein the charged particle beam has an illumination field as the beam illuminates the selected reticle subregion, the illumination field being variable so as to generate an effective trapezoidal beam profile as the selected reticle subregion is illuminated;

(c) a projection system configured and situated so as to form a pattern on a substrate by guiding the charged particle beam passing through the reticle to the substrate;

(d) a reticle stage operable to hold the reticle and move the reticle in a stage-scanning direction perpendicular to a propagation direction of the charged particle beam illuminating the selected reticle subregion;

(e) a wafer stage operable to hold the substrate and move the substrate in the stage-scanning direction; and (f) a deflector configured and situated so as to deflect the charged particle beam in a beam-scanning direction perpendicular to the stage-scanning direction so as to projection-transfer the reticle subregions to corresponding locations on the substrate, wherein the projection-transferred subregions are adjacent each other on the substrate with a region therebetween in which the respective peripheral portions overlap each other.

* * * * *

UNITED STATES PATENT AND TRADEMARK OFFICE
CERTIFICATE OF CORRECTION

PATENT NO.    : 6,201,598 B1                                           Page 1 of 1
DATED         : March 13, 2001
INVENTOR(S)   : Osamu Arai It is certified that error appears in the above-identified patent and that said Letters Patent is hereby corrected as shown below:

<u>Title page,</u>
ABSTRACT, item [57], change "are have so as to include a center" to -- are configured so as to include a center --

Signed and Sealed this

Ninth Day of April, 2002

Attest:

Attesting Officer

JAMES E. ROGAN
*Director of the United States Patent and Trademark Office*